(12) United States Patent
Sakaguchi (10) Patent No.: US 11,948,708 B2
(45) Date of Patent: Apr. 2, 2024

(54) RESISTANCE DEVICE AND CURRENT DETECTION CIRCUIT INCLUDING THE RESISTANCE DEVICE

(71) Applicant: ABLIC Inc., Tokyo (JP)

(72) Inventor: Kaoru Sakaguchi, Tokyo (JP)

(73) Assignee: ABLIC INC., Nagano (JP)

( * ) Notice: Subject to any disclaimer, the term of this patent is extended or adjusted under 35 U.S.C. 154(b) by 310 days.

(21) Appl. No.: 17/545,491

(22) Filed: Dec. 8, 2021

(65) Prior Publication Data
US 2022/0189668 A1 Jun. 16, 2022

(30) Foreign Application Priority Data

Dec. 15, 2020 (JP) ................................. 2020-207210

(51) Int. Cl.
*H01C 17/23* (2006.01)
*H01C 1/14* (2006.01)

(52) U.S. Cl.
CPC ............... *H01C 17/23* (2013.01); *H01C 1/14* (2013.01)

(58) Field of Classification Search
CPC .................................. H01C 17/23; H01C 1/14
See application file for complete search history.

(56) References Cited

U.S. PATENT DOCUMENTS

| | | | | |
|---|---|---|---|---|
| 6,331,768 B1 * | 12/2001 | Drori | ...................... | H03H 7/24 323/298 |
| 6,725,436 B2 * | 4/2004 | Koike | ................. | H01L 27/0802 257/E27.047 |
| 7,663,470 B2 * | 2/2010 | Kimura | .................. | H01C 10/14 338/195 |
| 2006/0266646 A1 * | 11/2006 | Kimura | .................. | H01C 10/06 204/425 |
| 2008/0218248 A1 * | 9/2008 | Kim | ....................... | H01C 13/02 327/525 |
| 2015/0214836 A1 | 7/2015 | Tsumura | | |
| 2020/0044011 A1 | 2/2020 | Saito et al. | | |

FOREIGN PATENT DOCUMENTS

| | | | | |
|---|---|---|---|---|
| EP | 3401932 A1 * | 11/2018 | ............. | H01C 10/06 |
| JP | 2006-332175 A | 12/2006 | | |
| JP | 2014-059620 A | 4/2014 | | |
| JP | 2020-021909 A | 2/2020 | | |

* cited by examiner

*Primary Examiner* — Kyung S Lee
(74) *Attorney, Agent, or Firm* — Crowell & Moring LLP (57) ABSTRACT

To provide a resistance device which has a small temperature dependence, in which a resistance value is adjustable in a wide range of from a high resistance value to a low resistance value, and which has a small circuit area, and to provide a current detection circuit including the resistance device. The resistance device is to be connected between two terminals, and a resistance value thereof is variable, the resistance device including: a reference resistor; a series variable resistor circuitry including at least one parallel variable resistor circuit which is connected in series to each other, and which each includes a resistor and a trimming element connected in parallel to the resistor; and a parallel variable resistor circuitry including at least one series variable resistor circuit which is connected in parallel to each other, and which each includes a resistor and a trimming element connected in series to the resistor.

5 Claims, 8 Drawing Sheets

|  | | resistance value | number of resistor(s) |
|---|---|---|---|
| reference resistor R0 | | 1/2R | 2 |
| serial variable resistor circuitry 10 | RP(1) | 4R | 4 |
|  | RP(2) | 2R | 2 |
|  | RP(3) | 1R | 1 |
|  | RP(4) | 1/2R | 2 |
|  | RP(5) | 1/4R | 4 |
| parallel variable resistor circuitry 20 | RS(1) | 1R | 1 |
|  | RS(2) | 2R | 2 |
|  | RS(3) | 4R | 4 |
|  | RS(4) | 8R | 8 |
|  | RS(5) | 16R | 16 |
|  |  | TOTAL | 46 |

R: resistance value of unit resistor

FIG. 7

|  | | resistance value | number of resistor(s) |
|---|---|---|---|
| reference resistor RcO | | 1/4R | 4 |
| variable resistor circuitry | RcP(1) | 4R | 4 |
| | RcP(2) | 2R | 2 |
| | RcP(3) | 1R | 1 |
| | RcP(4) | 1/2R | 2 |
| | RcP(5) | 1/4R | 4 |
| | RcP(6) | 1/8R | 8 |
| | RcP(7) | 1/16R | 16 |
| | RcP(8) | 1/32R | 32 |
| | RcP(9) | 1/64R | 64 |
| | RcP(10) | 1/128R | 128 |
| | | TOTAL | 265 |

R: resistance value of unit resistor

RESISTANCE DEVICE AND CURRENT DETECTION CIRCUIT INCLUDING THE RESISTANCE DEVICE

RELATED APPLICATIONS

This application claims priority to Japanese Patent Application No. 2020-207210, filed on Dec. 15, 2020, the entire content of which is incorporated herein by reference.

BACKGROUND OF THE INVENTION

1. Field of the Invention

The present invention relates to a resistance device and a current detection circuit including the resistance device.

2. Description of the Related Art

There has been known a technology in which, in a resistance device of a semiconductor integrated circuit, an insulating layer is formed on a silicon substrate, and a polysilicon layer formed on the insulating layer is used as a resistance element. It is known that a temperature dependence of a resistance value of polysilicon used as the resistance element changes depending on a dose amount at the time of ion-implanting impurities with respect to the polysilicon (see, for example, Japanese Patent Application Laid-open No. 2020-21909).

In consideration of the temperature dependence of the resistance value of polysilicon, in order to obtain a polysilicon resistance element having a small temperature dependence, the dose amount into the polysilicon layer is controlled so as to fall within a certain range. Meanwhile, a sheet resistance value (resistance value per area) of polysilicon depends on the dose amount. Thus, a sheet resistance value of a polysilicon resistor having a small temperature dependence falls within a certain range.

Further, in a case in which a constant voltage output circuit is formed of a semiconductor integrated circuit, for example, the resistance value of the resistance device is changed by performing trimming through use of a trimming element so that a voltage dividing ratio of a voltage divider circuit is set to a desired value.

Specifically, in a case in which a resistance value of a unit resistor is represented by 1R, for example, each resistor of which a resistance value is respectively represented by, for example, $\frac{1}{16}R$, $\frac{1}{8}R$, $\frac{1}{4}R$, $\frac{1}{2}R$, and 1R is prepared. Desired resistors selected from the prepared resistors are connected in series to each other, and a fuse is provided in parallel to each of the resistors. Those fuses are cut as appropriate in a trimming step at the time of manufacture so that a combined resistance of the entire resistance device is set to a desired resistance value. The resistance value of each resistor connected in parallel to the fuse is set to 2 to the power of "n" ("n" is a successive integer) of the unit resistor. In this manner, there can be obtained a resistance device having a desired resistance value within a range of substantially successive resistance values.

In a case in which a current detection circuit is to be achieved by a semiconductor integrated circuit, as a method of detecting a current in a range of mainly from several milliamperes (mA) to several hundreds of mA, current sensing is performed by causing a current to flow through a resistance device for current detection and measuring a voltage generated at this time. In such a resistance device for current detection, it is preferred that the temperature dependence of the resistance value be small. In addition, in the resistance device, it is preferred that the resistance value be adjustable with high accuracy over a wide range of from a high resistance value to a low resistance value, depending on a current value desired to be detected.

However, in consideration of adjusting the resistance value with high accuracy, the conventional resistance device in which the resistance value is changeable may have the minimum resistance value of the resistor connected in parallel to the fuse as low as possible. In the resistance element formed of polysilicon, as described above, the sheet resistance value in the case of the small temperature dependence is constant. Thus, the resistance value of the unit resistor cannot be decreased as appropriate.

As a technology of decreasing the minimum resistance value of the resistance device, for example, there are known a first technology of increasing the number of resistors connected in parallel to each other and a second technology of decreasing a length L of the unit resistor and increasing a width W of the unit resistor.

However, in a case in which the first technology of increasing the number of resistors connected in parallel to each other is applied, in order to achieve "n" resistance values smaller than the resistance value 1R of the unit resistor, that is, smaller resistance values such as $\frac{1}{32}R$, $\frac{1}{64}R$, and $\frac{1}{128}R$, the conventional resistor device in view of the first technology includes a configuration in which each of 32, 64, and 128 resistance elements are connected in parallel to each other. Such a configuration in which the resistance elements are connected in parallel to each other includes a very large number of resistance elements. The configuration including the very large number of resistance elements leads to an increase in a circuit area, and thereby leads to an increase in cost of a semiconductor chip.

Further, in a case in which the resistance value of the unit resistor is decreased by adopting the second technology of decreasing the length L of the unit resistor and increasing the width W of the unit resistor, the number of series resistors for use to adjust the resistance value of the entire resistance device to be a higher resistance value is increased. In this case, as is the case with adopting the first technology, the circuit area is increased, thereby leading to the increase in cost of the semiconductor chip.

SUMMARY OF THE INVENTION

The present invention has an object to provide a resistance device which has a small temperature dependence, in which a resistance value is substantially successively adjustable in a wide range of from a high resistance value to a low resistance value, and which has a small circuit area, and to provide a current detection circuit including the resistance device.

A resistance device according to at least one embodiment of the present invention is a resistance device which is to be connected between a first terminal and a second terminal, and in which a resistance value is variable. The resistance device includes: a reference resistor; a series variable resistor circuitry which is connected in series to the reference resistor, and which includes at least one parallel variable resistor circuit connected in series to each other, the at least one parallel variable resistor circuit each including a resistor and a trimming element connected in parallel to the resistor; and a parallel variable resistor circuitry which is connected in parallel to the reference resistor, and which includes at least one series variable resistor circuit connected in parallel to each other, the at least one series variable resistor circuit including a resistor and a trimming element connected in series to the resistor.

According to the resistor device, a temperature dependence can be small, and a resistance value is substantially successively adjustable in a wide range of from a high resistance value to a low resistance value.

DETAILED DESCRIPTION OF THE PREFERRED EMBODIMENTS

Now, a resistance device according to at least one embodiment of the present invention and a current detection circuit including the resistance device are described with reference to the drawings.

Figure 1:
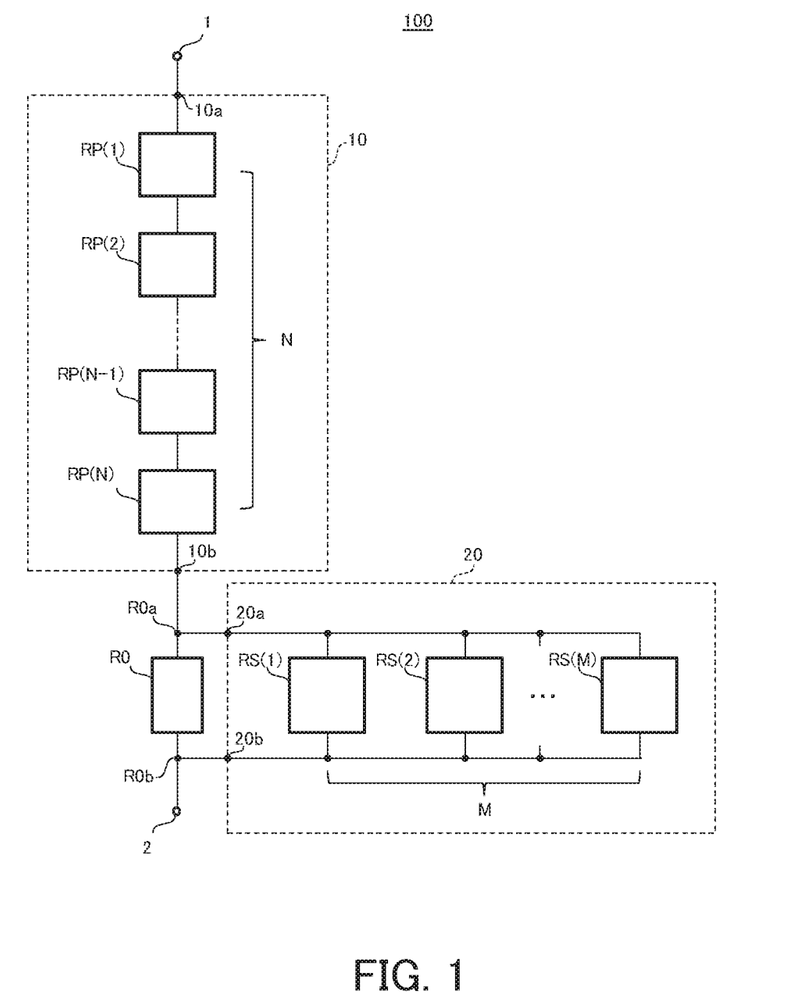
FIG. 1 is a configuration diagram for illustrating a generalized configuration (N parallel variable resistor circuits and M series variable resistor circuits) of a resistance device of at least one embodiment of the present invention.

FIG. 1 is a configuration diagram for illustrating a generalized configuration (N parallel variable resistor circuits and M series variable resistor circuits, where N and M are each an integer of 1 or more) of a resistance device 100 serving as an example of a resistance device according to at least one embodiment of the present invention.

The resistance device 100 includes a first terminal 1, a second terminal 2, a reference resistor R0, a series variable resistor circuitry 10 connected in series to the reference resistor R0, and a parallel variable resistor circuitry 20 connected in parallel to the reference resistor R0.

The reference resistor R0 includes a first end R0a and a second end R0b as both ends, and a resistance element including a polysilicon layer having a length L and a width W. The resistance element of the reference resistor R0 is formed of a single resistance element or a plurality of resistance elements connected in series or parallel to each other.

In this case, a resistance element which is formed of the same polysilicon layer as the reference resistor R0, and has a length L and a width W being the same length and the same width as the reference resistor R0 is referred to as "unit resistor." Further, it is assumed that, regarding the polysilicon layer, a dose amount of ion implantation at the time of manufacture is adjusted so that an ideal temperature dependence becomes zero.

The series variable resistor circuitry 10 includes a first end 10a to be connected to the first terminal 1, N parallel variable resistor circuits RP(1) to RP(N), and a second end 10b to be connected to the first end R0a of the reference resistor R0.

In the N parallel variable resistor circuits RP(1) to RP(N), in order from the first end 10a toward the second end 10b, the parallel variable resistor circuit RP(1), the parallel variable resistor circuit RP(2), . . . (omitted) . . . , the parallel variable resistor circuit RP(N−1), and the parallel variable resistor circuit RP(N) are connected in series to each other.

The parallel variable resistor circuitry 20 includes a first end 20a to be connected to the first end R0a of the reference resistor R0, M series variable resistor circuits RS(1) to RS(M), and a second end 20b to be connected to the second end R0b of the reference resistor R0.

In the M series variable resistor circuits RS(1) to RS(M), between the first end 20a and the second end 20b, the series variable resistor circuit RS(1), the series variable resistor circuit RS(2), . . . (omitted) . . . , the series variable resistor circuit RS(M−1), and the series variable resistor circuit RS(M) are connected in parallel to each other. Further, the first end 20a and the second end 20b are connected to the first end R0a and the second end R0b, respectively. That is, each of the series variable resistor circuits RS(1) to RS(M) is connected in parallel to also the reference resistor R0.

A resistance value of the entire resistance device 100 between the first terminal 1 and the second terminal 2 is determined based on a combined resistance obtained by the reference resistor R0, the series variable resistor circuitry 10, and the parallel variable resistor circuitry 20. The parallel variable resistor circuits RP(1) to RP(N) and the series variable resistor circuits RS(1) to RS(M) each include a trimming element as described later. Each of the parallel variable resistor circuits RP(1) to RP(N) and the series variable resistor circuits RS(1) to RS(M) is configured so that its resistance value is adjustable by bringing the trimming element into a connected state or a non-connected state.

Figure 2:
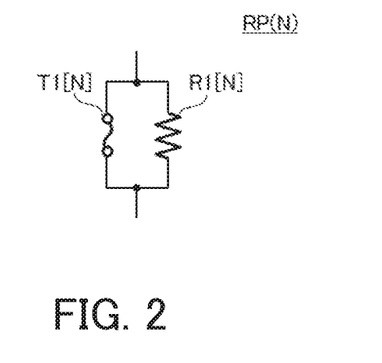
FIG. 2 is a circuit diagram for illustrating a configuration example of the parallel variable resistor circuit in the resistance device of the at least one embodiment.

FIG. 2 is a circuit diagram for illustrating a configuration example of the parallel variable resistor circuit RP(N).

The N parallel variable resistor circuits RP(1) to RP(N) each include a resistor R1 and a trimming element T1 connected in parallel to the resistor R1. That is, an X-th parallel variable resistor circuit RP(X) includes a resistor R1[X] serving as a resistor, and a trimming element T1[X] serving as a trimming element connected in parallel to the resistor R1[X]. In this case, X is an integer satisfying 1≥X≥N. An N-th parallel variable resistor circuit RP(N) includes a resistor R1[N] serving as an N-th resistor, and a trimming element T1[N] serving as an N-th trimming element connected in parallel to the resistor R1[N].

One terminal of the parallel variable resistor circuit RP(X) is connected to a first end of the trimming element T1[X] and a first end of the resistor R1[X]. Another end of the parallel variable resistor circuit RP(X) is connected to a second end of the trimming element T1[X] and a second end of the resistor R1[X].

In this case, the resistor R1[X] is formed of one unit resistor or a plurality of unit resistors connected in series or parallel to each other. The trimming element T1[X] is an element capable of switching from a connected state to a non-connected state, and is, for example, a fuse. The fuse is in the connected state in an initial state before a trimming step. Further, a resistance value of the fuse is sufficiently smaller than a resistance value of the resistor R1[X]. A combined resistance of the fuse in the connected state and the resistor R1[X] substantially matches the resistance value of the fuse.

In the trimming step, in a case in which the trimming element T1[X] is brought into the non-connected state, that is, in a case in which the fuse is cut, the resistance value of the fuse becomes much higher than the resistance value of the resistor R1[X]. A combined resistance of the fuse in the non-connected state and the resistor R1[X] substantially matches the resistance value of the resistor R1[X]. As described above, the resistance value of the parallel variable resistor circuit RP(X) is changed based on whether or not the fuse is processed (cut), that is, the connected state or the non-connected state of the trimming element T1[X].

Figure 3:
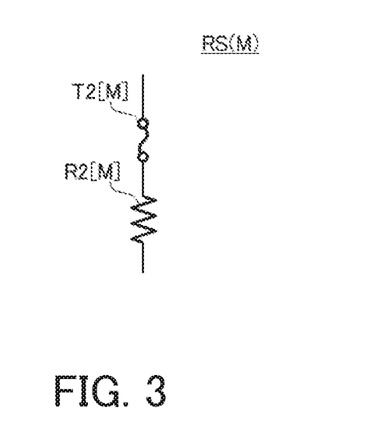
FIG. 3 is a circuit diagram for illustrating a configuration example of the series variable resistor circuit in the resistance device of the at least one embodiment.

FIG. 3 is a circuit diagram for illustrating a configuration example of the series variable resistor circuit RS(M).

The M series variable resistor circuits RS each include a resistor R2 and a trimming element T2 connected in series to the resistor R2. That is, an X-th series variable resistor circuit RS(X) includes a resistor R2[X] serving as a resistor, and a trimming element T2[X] serving as a trimming element connected in series to the resistor R2[X]. In this case, X is an integer satisfying 1≤X≤M. An M-th series variable resistor circuit RS(M) includes a resistor R2[M] serving as an M-th resistor, and a trimming element T2[M] serving as an M-th trimming element connected in series to the resistor R2[M].

One terminal of the series variable resistor circuit RS(X) is connected to a first end of the trimming element T2[X]. A second end of the trimming element T2[X] is connected to a first end of the resistor R2[X]. A second end of the resistor R2[X] is connected to another terminal of the series variable resistor circuit RS(X).

In this case, the resistor R2[X] is formed of one unit resistor or a plurality of unit resistors connected in series or parallel to each other. The trimming element T2[X] is an element capable of switching from a connected state to a non-connected state, and is, for example, a fuse. A resistance value of the fuse is sufficiently smaller than a resistance value of the resistor R2[X]. A combined resistance of the fuse serving as the trimming element T2[X] and the resistor R2[X] substantially matches the resistance value of the resistor R2[X].

In the trimming step, in a case in which the trimming element T2[X] is brought into the non-connected state, that is, in a case in which the fuse is cut, the resistance value of the fuse becomes much higher than the resistance value of the resistor R2[X]. A combined resistance of the fuse in the non-connected state and the resistor R2[X] substantially matches the resistance value of the fuse in the non-connected state, and becomes sufficiently(match) higher than the resistance value of the resistor R2[X]. As described above, the resistance value of the series variable resistor circuit RS(X) is changed based on whether or not the fuse is processed (cut), that is, the connected state or the non-connected state of the trimming element T2[X].

It is preferred that the resistance device 100 be configured so that the resistance value is adjustable with high accuracy over the entire wide range of from a high resistance value to a low resistance value. In consideration of making the resistance value to be adjustable with high accuracy over the entire wide range of from a high resistance value to a low resistance value, it is preferred that the resistance device 100 be configured so as to satisfy the following expression (1).

$$2R_0 - (R_0^{-1} + R_{2max}^{-1})^{-1} - R_{para} - R_{1min} > 0 \quad (1)$$

In the expression (1), $R_0$ represents a resistance value of the reference resistor R0, $R_{para}$ represents a combined resistance value of the reference resistor R0 and the parallel variable resistor circuitry 20 before trimming, $R_{1min}$ represents the smallest resistance value among resistance values $R_{11}$ to $R_{1N}$ of the resistor R1, and $R_{2max}$ represents the largest resistance value among resistance values $R_{21}$ to $R_{2M}$ of the resistor R2.

According to the resistance device 100 following the above-mentioned expression (1), the adjustment accuracy is not deteriorated in a specific region of resistance values that may be obtained after the trimming is performed. That is, the resistance value can be adjusted with high accuracy substantially successively in a wide range.

Further, in view of suppressing an increase in area of the resistance device 100, it is effective to reduce an overlap of ranges in which the resistance value is adjusted by the series variable resistor circuitry 10 and the parallel variable resistor circuitry 20. In consideration of reducing the circuit area so as to fall within an appropriate range in the resistance device 100, it is preferred that the resistance device 100 be configured so as to satisfy the following expression (2). In the following expression (2), $R_0$, $R_{para}$, and $R_{1min}$ are the same as those of the above-mentioned expression (1).

$$\frac{R_{1min} - (R_0 - R_{para})}{R_0} + 0.3 > 0 \quad (2)$$

According to the resistance device 100 following the above-mentioned expression (2), the overlap of the ranges in which the resistance value is adjusted by the series variable resistor circuitry 10 and the parallel variable resistor circuitry 20 can be reduced, thereby being capable of suppressing the increase in circuit area.

The resistance device 100 configured so as to satisfy both of the above-mentioned expression (1) and the above-mentioned expression (2) is more preferred than the resistance device 100 configured so as to satisfy either one of the above-mentioned expressions (1) and (2). In the resistance device 100 configured so as to satisfy both of the above-mentioned expression (1) and the above-mentioned expression (2), the resistance value can be adjusted with high accuracy over the entire wide range of from a high resistance value to a low resistance value, and further the increase in circuit area can be suppressed.

The range in which the resistance value of the resistance device 100 is adjusted corresponds to a range of from a state in which all of the trimming elements T1[1] to T1[N] and the trimming elements T2[1] to T2[M] are connected to a state in which all of the trimming elements T1[1] to T1[N] and the trimming elements T2[1] to T2[M] are non-connected (cut). In a case in which the adjustable minimum resistance value is represented by $R_{100min}$, the adjustable maximum resistance value is represented by $R_{100max}$, and the resistance value of the fuse is ignored, $R_{100min}$ and $R_{100max}$ are expressed as the following expression (3) and the following expression (4), respectively. In this case, X is an integer satisfying 1≤X≤N.

$$R_{100min} = R_{para} \quad (3)$$

$$R_{100max} = R_0 + \Sigma_{x=1}^{N} R_{1X} \quad (4)$$

The resistance value of the resistance device 100 can be adjusted within a range of from $R_{100min}$ to $R_{100max}$. The range in which the resistance value of the resistance device 100 is adjustable can be easily changed by changing a design value of N representing the number of parallel variable resistor circuits RP or M representing the number of series variable resistor circuits RS, and the number of resistors.

Further, regarding the combined resistance of the resistance device 100, the most minute adjustment of the resistance value is allowed by performing trimming of the series variable resistor circuit including the resistor having the resistance value $R_{2max}$. In the resistance device 100, if the resistance value is desired to be adjusted with more minute accuracy, the adjustment can be achieved by increasing the resistance value of the resistor R2 in the series variable resistor circuit RS.

In the conventional resistance device, the adjustment accuracy has been improved by decreasing the resistance value of the resistor connected in parallel to the fuse. However, the resistance value of the fuse and the resistance value of the resistor come close to each other. Thus, an error from the target is caused in the change of the resistance value by performing the trimming. Further, the fuse is formed by performing ion implantation at a dose amount different from that of a polysilicon resistor or by performing salicidation. Thus, the temperature dependence of the resistance value is different, and the temperature dependence of the resistance device is also deteriorated.

In contrast, according to the resistance device 100 having the above-mentioned configuration, in order to improve the adjustment accuracy of the resistance value, the resistance value of the resistor in the series variable resistor circuit RS(M) may be increased. No matter how high the adjustment accuracy of the resistance value is improved, the resistance value of the fuse and the resistance value of the resistor do not come close to each other. Thus, no large error is caused in the change of the resistance value, and further no deterioration of the temperature dependence is caused. According to the resistance device 100, the adjustment accuracy of the resistance value of the resistance device 100 can be improved as appropriate.

Figure 4:
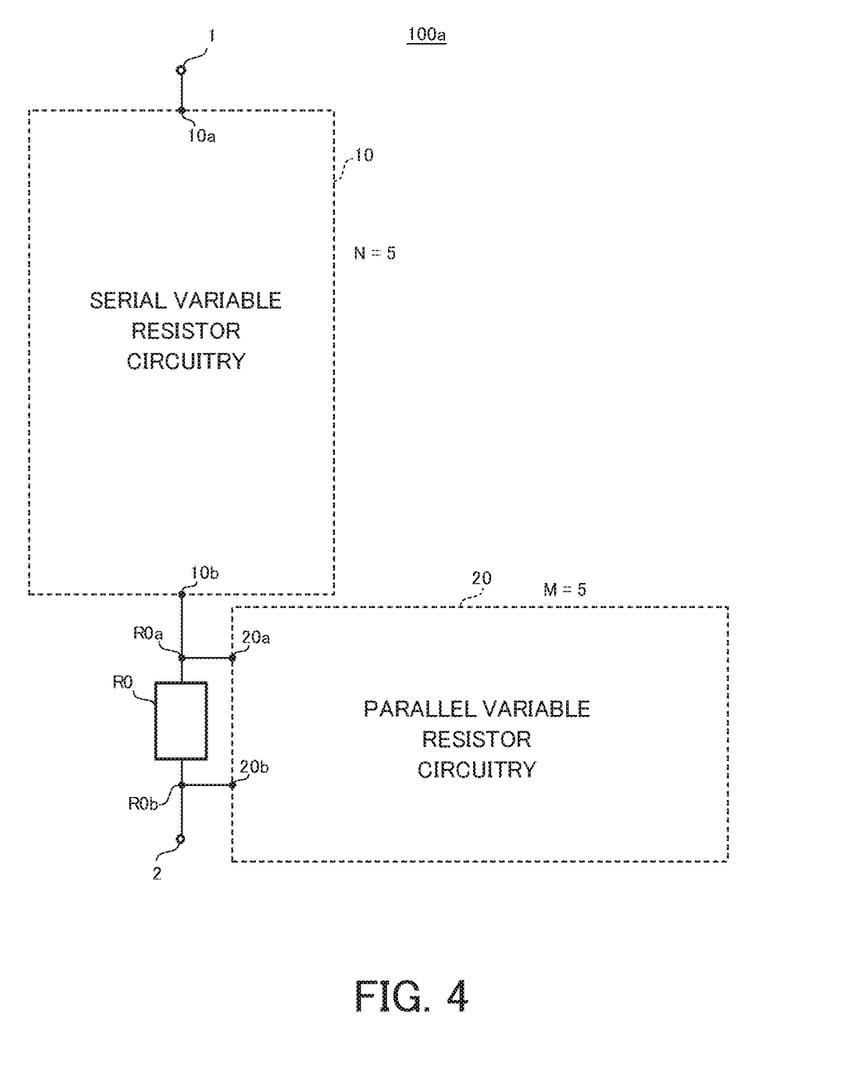
FIG. 4 is a configuration diagram for illustrating a specific configuration example (five parallel variable resistor circuits and five series variable resistor circuits) of the resistance device of the at least one embodiment.

FIG. 4 is a configuration diagram for illustrating a configuration example (in FIG. 4, the series variable resistor circuitry 10 and the parallel variable resistor circuitry 20 are illustrated in a simple manner) of a resistance device 100a serving as a specific example of the resistance device 100.

The resistance device 100a is a resistance device 100 configured so as to satisfy the above-mentioned expression (1), where N=5 and M=5. In the resistance device 100a, the reference resistor R0 is configured so that a resistor R01 and a resistor R02 are connected in parallel to each other. The resistance value $R_0$ of the reference resistor R0 obtained by connecting the resistor R01 and the resistor R02 in parallel to each other is expressed as ½R.

Figure 5:
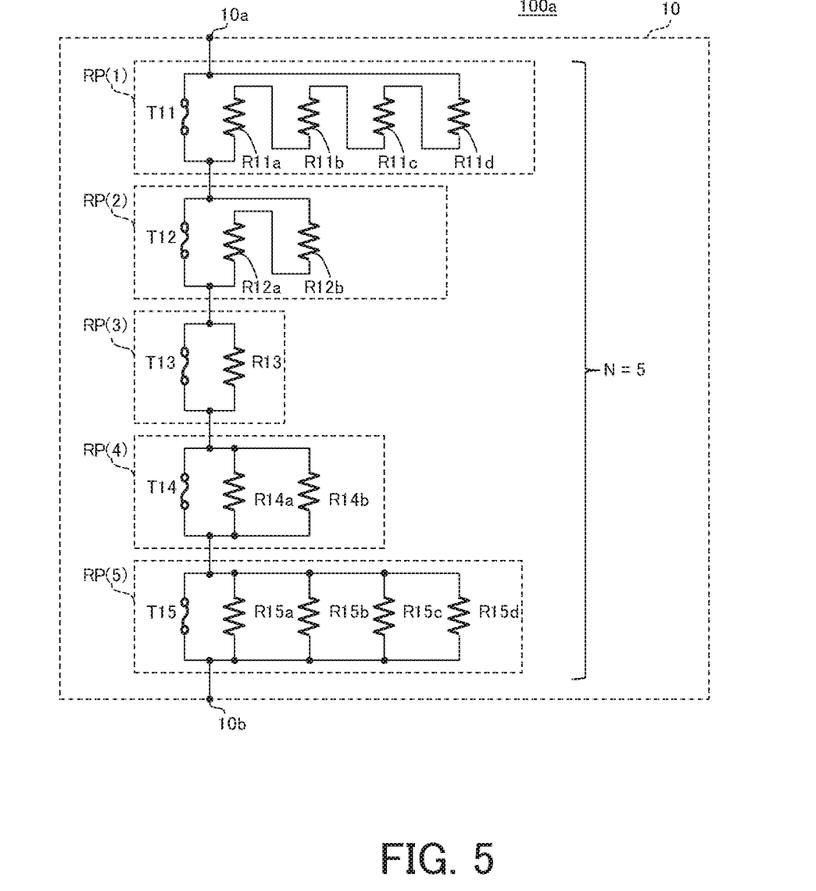
FIG. 5 is a circuit diagram for illustrating a specific configuration example of a series variable resistor circuitry (in a case of five parallel variable resistor circuits (N=5)).

FIG. 5 is a circuit diagram for illustrating a specific configuration example of the series variable resistor circuitry 10 (in a case of five parallel variable resistor circuits (N=5)) in the resistance device 100a.

The resistance value of the resistor of each parallel variable resistor circuit in the series variable resistor circuitry 10 is set to 4R in RP(1), 2R in RP(2), 1R in RP(3), ½R in RP(4), and ¼R in RP(5).

Figure 6:
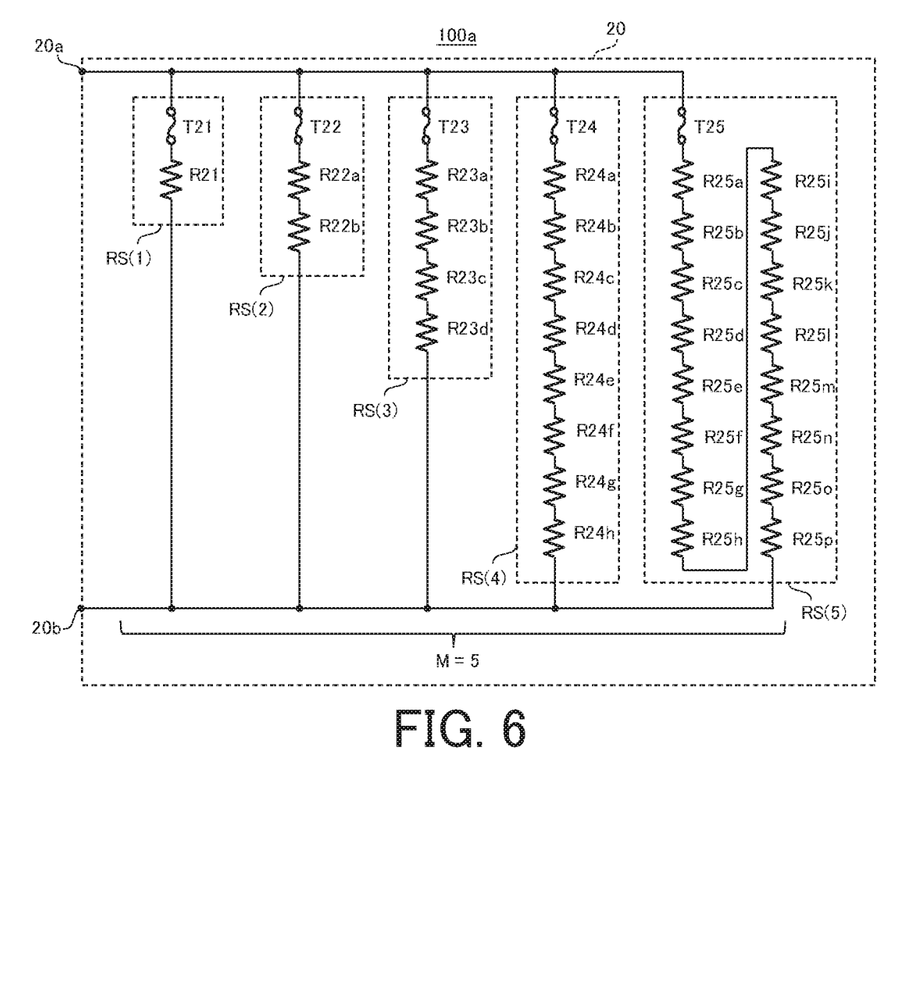
FIG. 6 is a circuit diagram for illustrating a specific configuration example of a parallel variable resistor circuitry (in a case of five series variable resistor circuits (M=5)).

FIG. 6 is a circuit diagram for illustrating a specific configuration example of the parallel variable resistor circuitry 20 (in a case of five series variable resistor circuits (M=5)) in the resistance device 100a.

The resistance value of the resistor of each series variable resistor circuit in the parallel variable resistor circuitry 20 is set to 1R in RS(1), 2R in RS(2), 4R in RS(3), 8R in RS(4), and 16R in RS(5).

In the resistance device 100a including the series variable resistor circuitry 10 and the parallel variable resistor circuitry 20 described above, the left side of the above-mentioned expression (1) is calculated to be about 0.011. Thus, the inequality of the above-mentioned expression (1) is satisfied. Further, the left side of the above-mentioned expression (2) is calculated to be about 0.14. Thus, the inequality of the above-mentioned expression (2) is also satisfied. Thus, the resistance device 100a is configured so that the resistance value can be adjusted with high accuracy over the entire wide range of from a high resistance value to a low resistance value, and further the increase in circuit area is suppressed.

Figure 7:
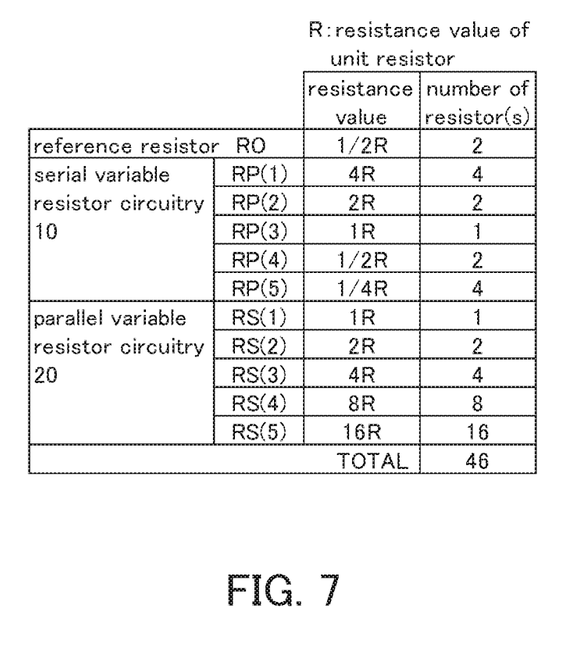
FIG. 7 is a table for showing the number of resistors in the specific configuration example (five parallel variable resistor circuits and five series variable resistor circuits) of the resistance device of the at least one embodiment.
Figure 8:
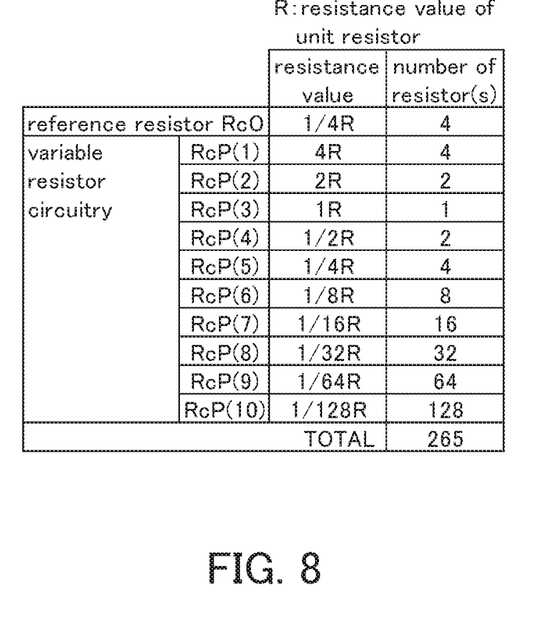
FIG. 8 is a table for showing the number of resistors in a resistance device of a comparative example.

FIG. 7 and FIG. 8 are tables for showing the number of resistors in each of the resistance device 100 and a resistance device of a comparative example.

In this case, the resistance device of the comparative example (not shown) is a resistance device which includes ten variable resistor circuits, that is, the same number of variable resistor circuits as the resistance device 100, and is configured to have the minimum adjustment accuracy equivalent to that of the resistance device 100a. Specifically, the resistance device of the comparative example is configured to include, as compared to the resistance device 100a, in place of the series variable resistor circuitry 10 and the parallel variable resistor circuitry 20, variable resistor circuits RcP(1) to RcP(10) corresponding to parallel variable resistor circuits RP(1) to RP(10). Further, the resistance device of the comparative example is configured to include, as compared to the resistance device 100a, in place of the reference resistor R0, a reference resistor Rc0 having a resistance value subsequently equal to the resistance value of the combined resistance of the reference resistor R0 and the parallel variable resistor circuitry 20.

In the resistance device 100a, the total number of resistors of the reference resistor R0, the parallel variable resistor circuits RP(1) to RP(5), and the series variable resistor circuits RS(1) to RS(5) is 46 (see FIG. 7). Meanwhile, in the resistance device of the comparative example, the total number of resistors of the reference resistor Rc0 and the variable resistor circuits RcP(1) to RcP(10) is 265 (see FIG. 8).

The resistance device 100a and the resistance device of the comparative example are compared with each other. The total number (46) of resistors of the resistance device 100a can be reduced to about 17%, that is, substantially ⅙ of the total number (265) of resistors of the resistance device of the comparative example. In other words, in the resistance device 100a, the circuit area occupied by the resistance elements can be reduced to substantially ⅙ of the circuit area occupied by the resistance elements of the resistance device of the comparative example. The reduction of the occupied circuit area can suppress the increase in cost of the semiconductor chip.

Further, the resistance device 100a has the minimum resistance value of ¼R. In contrast, the resistance device of the comparative example has the minimum resistance value of ¹⁄₁₂₈R. The minimum resistance value (=¹⁄₁₂₈R) of the resistance device of the comparative example and the minimum resistance value (=¼R) of the resistance device 100a are compared with each other. The minimum resistance value of the resistance device of the comparative example is very small to be ¹⁄₃₂ of the minimum resistance value of the resistance device 100a. Thus, as compared to the resistance device 100a, a larger error is liable to be caused in the resistance value of the resistance device after the trimming due to the influence of the resistance value of the fuse. That is, in the resistance device 100a, as compared to the resistance device of the comparative example, the error of the resistance value of the resistance device 100a after the trimming can be reduced.

Next, a current detection circuit including the resistance device of the at least one embodiment is described.

Figure 9:
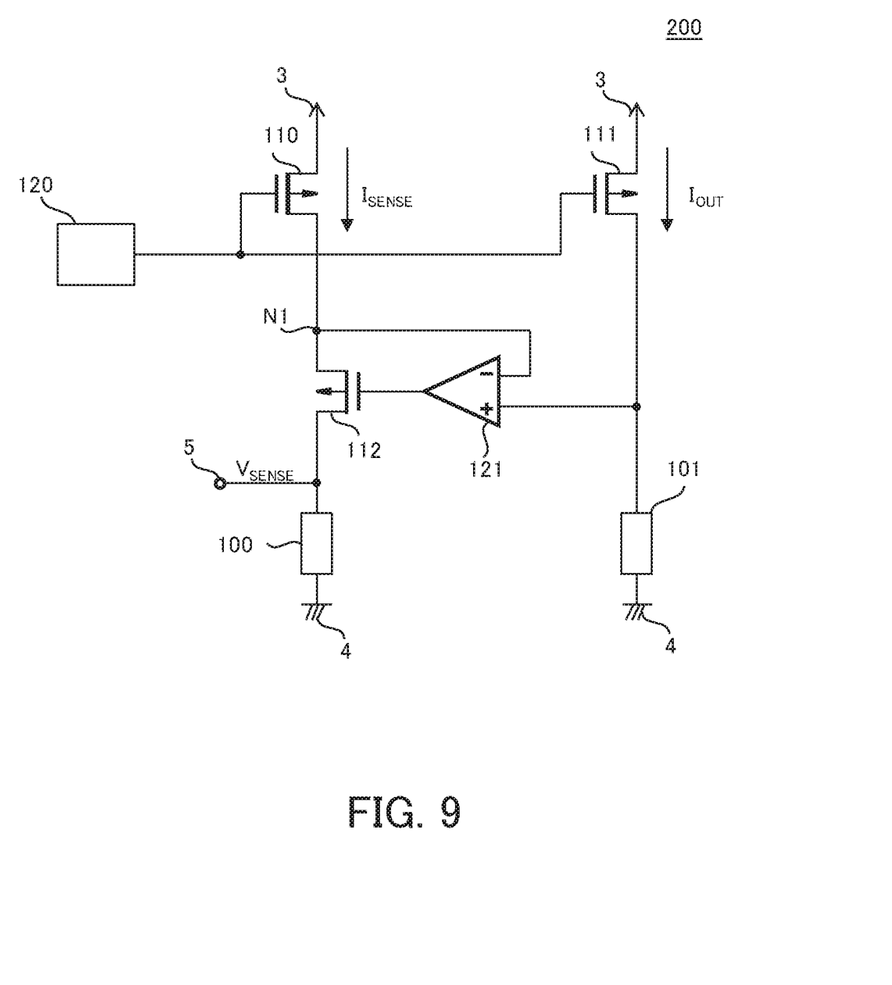
FIG. 9 is a circuit diagram for illustrating a configuration example of a current detection circuit including the resistance device of the at least one embodiment.

FIG. 9 is a circuit diagram for illustrating a configuration example of a current detection circuit 200 serving as an example of a current detection circuit of at least one embodiment of the present invention.

The current detection circuit 200 includes a power supply terminal 3, a ground terminal 4, a sense output terminal 5, the resistance device 100 serving as an example of the resistance device of the at least one embodiment, a load 101, a sense transistor 110, an output transistor 111, a PMOS transistor 112, a gate drive circuit 120, and a current sense amplifier 121. Further, the current detection circuit 200 is configured to detect an output current Iout flowing through the output transistor 111, and to supply, to the sense output terminal 5, a voltage obtained by causing a current proportional to the detected output current Tout to flow through the resistance device 100 so as to be converted.

Next, connection in the current detection circuit 200 is described.

The sense transistor 110 includes a source connected to the power supply terminal 3, a gate connected to an output terminal of the gate drive circuit 120 and a gate of the output transistor 111, and a drain connected to a source of the PMOS transistor 112 and an inverting input terminal (−) of the current sense amplifier 121. The output transistor 111 includes a source connected to the power supply terminal 3, and a drain connected to one terminal of the load 101 and a non-inverting input terminal (+) of the current sense amplifier 121.

Another terminal of the load 101 is connected to the ground terminal 4. An output terminal of the current sense amplifier 121 is connected to a gate of the PMOS transistor 112. A drain of the PMOS transistor 112 is connected to the first terminal of the resistance device 100 and the sense output terminal. The second terminal of the resistance device 100 is connected to the ground terminal 4.

Next, the operation of the current detection circuit 200 is described.

Between the source and the drain of the output transistor 111, the output current Tout flowing through the load 101 flows. The current sense amplifier 121 controls a gate voltage of the PMOS transistor 112 so that the voltage of the inverting input terminal and the voltage of the non-inverting input terminal match each other.

As a result of controlling the gate voltage of the PMOS transistor 112 so that the voltage of the inverting input terminal and the voltage of the non-inverting input terminal match each other, a drain voltage of the sense transistor 110 and a drain voltage of the output transistor 111 match each other. The sense transistor 110 and the output transistor 111 match each other in each of the source voltage, the gate voltage, and the drain voltage. Thus, a sense current Isense proportional to the output current of the output transistor 111 flows through the sense transistor 110.

The sense current Isense flows through the resistance device 100 via the PMOS transistor 112, and a sense voltage Vsense is generated across both ends of the resistance device 100 so as be supplied to the sense output terminal 5 serving as an output terminal. The sense voltage Vsense is a voltage obtained by subjecting the sense current Isense to current-voltage conversion by the resistors of the resistance device 100. Considering that the relation of the output current Tout, the sense current Isense, and the sense voltage Vsense, the sense voltage Vsense is proportional to the output current Tout, and the output current Tout can be detected by reading the sense voltage Vsense from the outside.

The accuracy of current detection in the current detection circuit 200 is affected by manufacturing variations. The current detection accuracy is affected by, as main factors, variations in resistance value of the resistance device 100, relative variations in characteristic between the sense transistor 110 and the output transistor 111, and an offset voltage between the input terminals of the current sense amplifier. The current detection circuit 200 includes the resistance device 100 so that the current detection range can be increased while the circuit area is reduced, and so that the variations in resistance value can be compensated for, thereby being capable of generating a sense voltage Vsense having a satisfactory accuracy.

Further, the trimming of the resistance device 100 is performed so that the relative variations in characteristic between the sense transistor 110 and the output transistor 111 and the influence of the offset voltage between the input terminals of the current sense amplifier are canceled out. In this manner, the accuracy of the current detection can be improved.

It is noted that the present invention is not limited to the above-described embodiments. The present invention can be carried out in various forms other than the examples described above at the implementation stage, and various omissions, replacements, and changes can be made without departing from the scope of the invention.

For example, the order of the connection of the resistors or the trimming elements may be changed within a range not affecting the combined resistance before or after the trimming.

For example, between the first terminal 1 and the second terminal 2, in addition to the series variable resistor circuitry 10 and the reference resistor R0, another resistance device being formed of the same unit resistor but having a different resistance value may be connected in series to the resistance device 100.

The trimming elements T1[1] to T1[N] and the trimming elements T2[1] to T2[M] are not limited to fuses. The trimming elements T1[1] to T1[N] and the trimming elements T2[1] to T2[M] are elements capable of switching from the connected state to the non-connected state, and may be, e.g., metal oxide semiconductor (MOS) transistors.

In each of the MOS transistors serving as the trimming elements T1[1] to T1[N] and the trimming elements T2[1] to T2[M], its gate voltage is controlled so that ON corresponding to the connected state and OFF corresponding to the non-connected state can be switched. Further, N representing the number of parallel variable resistor circuits RP(N) and M representing the number of series variable resistor circuits RS(M) are not always different numbers, and N and M may be the same number as long as each of them is an integer of 1 or more.

These embodiments and modifications thereof are included in the scope and gist of the present invention, and is also included in the scope of the present invention described in the claims and the equivalent scope thereof.

What is claimed is:

1. A resistance device which is to be connected between a first terminal and a second terminal, and in which a resistance value is variable, the resistance device comprising:
 a reference resistor;
 a series variable resistor circuitry which is connected in series to the reference resistor, and which includes at least one parallel variable resistor circuit connected in series to each other, the at least one parallel variable resistor circuit each including a resistor and a trimming element connected in parallel to the resistor; and
 a parallel variable resistor circuitry which is connected in parallel to the reference resistor, and which includes at least one series variable resistor circuit connected in parallel to each other, the at least one series variable resistor circuit each including a resistor and a trimming element connected in series to the resistor.

2. The resistance device according to claim 1, wherein the following inequality expression (1) is satisfied:

$$2R_0 - (R_0^{-1} + R_{2max}^{-1})^{-1} - R_{para} - R_{1min} > 0 \qquad (1)$$

where $R_0$ represents a resistance value of the reference resistor, $R_{para}$ represents a combined resistance of the reference resistor and the parallel variable resistor circuitry, $R_{1min}$ represents a smallest resistance value among resistance values of a resistor included in the at least one parallel variable resistor circuit, and $R_{2max}$ represents a largest resistance value among resistance values of a resistor included in the at least one series variable resistor circuit.

3. The resistance device according to claim 1, wherein the following inequality expression (2) is satisfied:

$$\frac{R_{1min} - (R_0 - R_{para})}{R_0} + 0.3 > 0 \qquad (2)$$

where $R_0$ represents a resistance value of the reference resistor, $R_{para}$ represents a combined resistance of the reference resistor and the parallel variable resistor circuitry, and $R_{1min}$ represents a smallest resistance value among resistance values of a resistor included in the at least one parallel variable resistor circuit.

4. The resistance device according to claim 1,
 wherein the resistance device is formed of a semiconductor containing a polysilicon layer, and
 wherein the reference resistor, at least one resistor included in the at least one parallel variable resistor circuit, and at least one resistor included in the at least one series variable resistor circuits are formed of the same polysilicon layer contained in the semiconductor.

5. A current detection circuit for detecting a current flowing through an output transistor, the current detection circuit comprising:
 an output terminal;
 the resistance device of claim 1; and
 the output transistor,
 wherein the resistance device has a resistance value adjusted so that a current proportional to a current flowing through the output transistor flows therethrough, and is configured to supply, to the output terminal, a voltage generated across both ends of the resistance device.

* * * * *